United States Patent
Paulasaari et al.

(10) Patent No.: US 10,889,690 B2
(45) Date of Patent: Jan. 12, 2021

(54) SILOXANE MONOMERS, THEIR POLYMERIZATION AND USES THEREOF

(71) Applicant: Inkron Oy, Espoo (FI)

(72) Inventors: Jyri Paulasaari, Espoo (FI); Juha Rantala, Espoo (FI)

(73) Assignee: Inkron Oy, Espoo (FI)

( * ) Notice: Subject to any disclaimer, the term of this patent is extended or adjusted under 35 U.S.C. 154(b) by 97 days.

(21) Appl. No.: 16/317,576

(22) PCT Filed: Jul. 14, 2017

(86) PCT No.: PCT/FI2017/050542
§ 371 (c)(1),
(2) Date: Jan. 14, 2019

(87) PCT Pub. No.: WO2018/011475
PCT Pub. Date: Jan. 18, 2018

(65) Prior Publication Data
US 2019/0225756 A1  Jul. 25, 2019

(30) Foreign Application Priority Data

Jul. 14, 2016  (FI) ..................................... 20160184

(51) Int. Cl.
| | | |
|---|---|---|
| *C08G 77/18* | (2006.01) | |
| *C09D 183/06* | (2006.01) | |
| *C08G 77/20* | (2006.01) | |
| *C08G 77/00* | (2006.01) | |
| *C08L 83/06* | (2006.01) | |
| *C07F 7/08* | (2006.01) | |
| *C07F 7/18* | (2006.01) | |
| *C08G 77/08* | (2006.01) | |
| *C08G 77/16* | (2006.01) | |
| *H01L 33/56* | (2010.01) | |

(52) U.S. Cl.
CPC .............. *C08G 77/18* (2013.01); *C07F 7/081* (2013.01); *C07F 7/0838* (2013.01); *C07F 7/1804* (2013.01); *C08G 77/08* (2013.01); *C08G 77/16* (2013.01); *C08G 77/20* (2013.01); *C08G 77/80* (2013.01); *C08L 83/06* (2013.01); *C09D 183/06* (2013.01); *H01L 33/56* (2013.01)

(58) Field of Classification Search
CPC .......... C08G 77/80; C08G 77/18; H01L 33/56
See application file for complete search history.

(56) References Cited

U.S. PATENT DOCUMENTS

| | | | | |
|---|---|---|---|---|
| 2,258,221 A | * | 10/1941 | Rochow | ................. C08G 77/14 174/121 SR |
| 3,385,878 A | | 5/1968 | Wu | |
| 4,278,784 A | | 7/1981 | Wong | |
| 6,492,204 B1 | | 12/2002 | Jacobs | |
| 6,806,509 B2 | | 10/2004 | Yoshino et al. | |
| 2004/0178509 A1 | | 9/2004 | Yoshino et al. | |
| 2009/0146324 A1 | | 6/2009 | Auld et al. | |
| 2010/0178620 A1 | * | 7/2010 | Dei | ....................... G03F 7/0757 430/325 |
| 2013/0045292 A1 | | 2/2013 | Zhou et al. | |
| 2013/0045552 A1 | | 2/2013 | Lyons et al. | |

FOREIGN PATENT DOCUMENTS

| | | |
|---|---|---|
| FI | 20155194 A | 7/2016 |
| SU | 427943 * | 5/1974 |
| SU | 427943 A1 | 5/1974 |
| WO | WO2016151192 A1 | 9/2016 |

OTHER PUBLICATIONS

Sobolev (Zhurnal Obshchei Khimii 39(12) (1969) 2691-2694) based on Database CA, Chemical Abstracts Service, 1970.*
Jiajia et al: An Efficient Ullmann-Type C—O Bond Formation Catalyzed by an Air-Stable Copper(I)-Bipyridyl Complex. J. Org. Chem, 2008, vol. 73, pp. 7814-7817.
Novel Chemical Solutions-Catalogue: CAS RN-1443342-27-5. Aug. 7, 2013.
Sobolev et al: Synthesis of organosilicon monomers containing radical with ether bonds. Database CA, Chemical Abstracts Service, 1970.

* cited by examiner

*Primary Examiner* — Kuo Liang Peng
(74) *Attorney, Agent, or Firm* — Laine IP Oy (57) ABSTRACT

Phenoxyphenylsilane monomers were synthesized and polymerized. The polymers have high refractive indices and excellent UV and thermal stability. Their water and oxygen permeability is lower than commercial phenyl silicone elastomers. They show good compatibility with metal oxide nanoparticles. The polymers of the invention are suitable as LED encapsulant, as light guide material in CMOS image sensors, in OLED devices, lasers and in other optical applications.

18 Claims, 4 Drawing Sheets

SILOXANE MONOMERS, THEIR POLYMERIZATION AND USES THEREOF

TECHNICAL FIELD

The present invention relates to silane monomers. In particular the present invention relates to high-RI siloxane monomers, to methods of synthesizing such monomers and to polymerization of the monomers to produce polymer of high refractive indices and excellent stability properties and good water and oxygen barrier.

The present materials are particularly useful as light extraction and/or passivation layers in optical devices, such as LEDs, OLEDs and similar devices.

BACKGROUND ART

Lighting industry is rapidly moving to LED-lighting systems. Efficiency and power output of a typical LED has risen quickly. Epoxies have traditionally been used as an encapsulant but the conventional materials can no longer handle the intense light flux and heat that state-of-the-art LEDs generate. Dimethylsilicone (PDMS), a known encapsulating material for electronic devices, has recently been used more and more as an encapsulant for LEDs due to better durability and resistance to yellowing than epoxies.

As far as the use of dimethylsilicone is concerned reference is made to U.S. Pat. Specifications Nos. 4,278,784, 6,492,204 and 6,806,509.

However, PDMS has a relatively low refractive index (RI~1.4) compared to LED-chip ('epi', e.g. InGaN, RI~2.5) and many phosphor materials used in white LEDs (for example yttrium aluminium garnet, 'YAG', RI~1.85). This refractive index mismatch creates internal reflections, which lower the light output and efficiency of the device. Replacing PDMS with higher RI phenyl silicones (RI~1.50 . . . 1.55) somewhat improves the situation but there is still a need for even higher RI materials that can withstand the conditions inside LEDs without yellowing and are suitable for LED manufacturing.

The art is further represented by US 2009146324, U.S. Pat. Nos. 2,258,221, 3,385,878, US 2013045292, US 2013045552, F1 20155194 and W. Fink, *Silylated polyphenyl ethers. Their preparation and some physical properties*; Helvetica Chimica Acta 1973, 56(1), 355-63.

SUMMARY OF INVENTION

Technical Problem

It is an aim of the present invention to remove at least a part of the problems relating to the known solutions and to provide a novel polymeric material which has high refractive index and excellent stability properties.

It is another aim of the present invention to provide novel monomers.

It is a third aim of the present invention to provide methods of producing polymers from the monomers.

It is a fourth aim of the present invention to provide the use of the novel polymeric materials.

Solution to Problem

In connection with the present invention, it has surprisingly been found that phenoxyphenylsilanes and bis-phenoxyphenylsilanes are excellent monomers for polymers suitable for use, for example, as LED encapsulants.

The present invention provides a siloxane monomer having the formula (p-Ph-O-Ph)$_2$Si(X)$_2$  I wherein
each X is a polymerizable group independently selected from hydrogen, lower alkoxy optionally containing an alkoxy substituent, halo, hydroxy or -OSiMe$_3$.

The present invention also provides a siloxane monomer having the formula p-(PhO)$_y$Ph-Si(X)$_3$  II wherein
each X is a polymerizable group independently selected from hydrogen, lower alkoxy optionally containing an alkoxy substituent, halo, hydroxy or -OSiMe$_3$, and y is 1 or 2.

The polymers are derived from phenoxyphenylsilane and/or bis-phenoxyphenylsilanes Particularly interesting polymers are derived from 1,5-Dimethyl-1,1,5,5-tetramethoxy-3,3-bis(p-phenoxyphenyl)-trisiloxane. Such polymers can be used as a light extraction and/or passivation layer in LED, OLED or other optical device, as a layer of a light emitting device, as a light extraction layer, chip passivation layer, chip interconnects passivation layer, encapsulation layer, a passivation layer and optical surface for a flip chip and EPI in a LED package.

More specifically, the monomers according to the present invention are characterized by what is stated in claims 1 to 5.

Polymers obtained from the monomers are characterized by what is stated in the characterizing part of claim 6 and polymer composites by what is stated in the characterizing part of claim 14.

The uses of the polymers are characterized by what is stated in claims 18 to 24.

Advantageous Effects of Invention

The present monomers are di- or triphenyl ether silanes.

Considerable advantages are obtainable by the present invention. Thus many of the polymers derived from phenoxyphenylsilane and/or bis-phenoxyphenylsilanes, for example by conventional hydrolysation and polymerization procedures, have refractive indices higher than phenylsiloxanes or phenylsilicones. These polymers are resistant to UV-A and blue light and have high thermal stability. Typically, a polymer of the present kind has Oxygen Transmission Rate (OTR) and Water Vapor Transmission Rate (WVTR) less than 50% of OTR and WVTR of phenylsilicone elastomers.

Together with composite nanoparticle filles, in particular with BaTiO$_3$ nanofillers, a clear film can be produced without any visible yellowing. Thus, as discussed in the examples, a film spin coated on a glass plate will remain clear and colorless after one week at 200° C.

By contrast, using methyl or phenyl silicone, a hazy film is attained with BaTiO$_3$ nanofillers.

Generally, the haze % of a film made from the present polymers is lower than 1.0, in particular lower than 0.75, typically lower than 0.5, for example lower than 0.35.

Based on its excellent properties, in particular a "BisOHmer" (disclosed below), can be used in light extraction and/or passivation layer in LED, OLED or other optical device.

The refractive indices (RIs) of the present polymers, optionally in combination with nanoparticle fillers, for example of the above kind, are generally greater than 1.7 (at 632 nm). Next, embodiments of the present technology will be described in more detail.

EMBODIMENTS

A first embodiment comprises a siloxane monomer having the formula $(Ph-O-Ph)_2Si(X)_2$    I wherein
each X is a hydrolysable group independently selected from hydrogen, lower alkoxy optionally containing an alkoxy substituent, halo, acetoxy, hydroxy or -OSiMe₃.

A second embodiment comprises a siloxane monomer having the formula $PhOPh-Si(X)_3$    IIa wherein
each X is a hydrolysable group independently selected from hydrogen, and lower alkoxy optionally containing an alkoxy substituent, halo, acetoxy, hydroxy or -OSiMe₃.

A third embodiment comprises a siloxane monomer having the formula $PhOPhOPh-Si(X)_3$    IIb wherein
each X is a hydrolysable group independently selected from hydrogen, and lower alkoxy optionally containing an alkoxy substituent, halo, acetoxy, hydroxy or -OSiMe₃.

In the above formulas, the phenoxy group can be positioned for example in para position on the phenyl group.

Preferably, in the meaning of X, lower alkoxy stands for an alkoxy group having 1 to 6 carbon atoms, in particular 1 to 4 carbon atoms. Examples of such alkoxy groups include methoxy (-OMe), ethoxy (-OEt), n- and i-propoxy (—OPr), n-, i- and t-butoxy (-OBu). Further examples include alkoxyethers, such as —O—CH₂CH₂—O—CH₃.

In the meaning of halo, X preferably stands for chloro (Cl) or bromo (Br).

In the above formulas, there are typically aryl groups, comprising for example 1 to 3 aromatic rings, said aryl groups being directly attached to a silicon atom. Such aryl groups are exemplified by aryls, such as phenyl, which may contain phenoxy-substituents.

However, it should be noted that it is also possible to attach the aryl groups indirectly, i.e. via a linker, such as a bivalent hydrocarbon chain, which optionally is saturated or unsaturated.

Thus, examples of aryl group attached to silicon include the following:

Si-(PhOPh)

Si-(PhOPhOPh)

Si—CH₂Ph

Si—CH₂CH₂Ph

Specific examples of monomers according to the above formulas are
bis(phenoxyphenyl)-dimethoxysilane;
bis(phenoxyphenyl)-dihydroxysilane;
bis(phenoxyphenyl)-bis(trimethylsiloxy)silane;
p-phenoxyphenyltrihydroxysilane;
p-phenoxyphenoxyphenyltrimethoxysilane and
1,5-dimethyl-1,1,5,5-tetramethoxy-3,3-bis(p-phenoxyphenyl)-trisiloxane ("BisOHmer")

In one embodiment, 1,5-dimethyl-1,1,5,5-tetramethoxy-3,3-bis(p-phenoxyphenyl)-trisiloxane is always employed as a monomer in the present process. In one embodiment, 1,5-dimethyl-1,1,5,5-tetramethoxy-3,3-bis(p-phenoxyphenyl)-trisiloxane is employed as a comonomer with comonomers of one, two or three of formulas I, IIa and IIb.

As will be discussed below, in one embodiment, oligomers or polymers obtained by polymerization or copolymerization of the monomer 1,5-dimethyl-1,1,5,5-tetramethoxy-3,3-bis(p-phenoxyphenyl)-trisiloxane, optionally with a monomer having reactive groups, will give a material which has a broad field of use. It can be employed for example as a light extraction and/or passivation layer in LED, OLED or other optical device. It can also be employed as a layer of a light emitting device, as a light extraction layer, a chip passivation layer, a chip interconnects passivation layer, an encapsulation layer, a passivation layer and optical surface for a flip chip and EPI in an LED package. Further uses include for layers of chip scale, wafer level and panel packagings of LEDs, optical sensors and, generally, optical devices.

The monomer having reactive groups is in one embodiment a cross-linkable monomer, for example a monomer comprising reactive groups selected from vinyl, epoxy and acryl or acrylate and combinations thereof.

The present monomers are phenyl ether silanes which do not contain any non-hydrolysable groups bonded to the silane, such as phenyl groups.

The monomers are conveniently prepared by Grignard synthesis, using tetra-alkoxysilane as starting monomer and bromophenyl phenyl ether or bromophenyl phenyl phenyl diether as the organohalide.

The starting silane can also be methyltrialkoxysilane or vinyltrialkoxy silane if extra functionality is needed. For example, vinyltrimethoxysilane can be used for crosslinking via vinyl group by radical or hydrosilylation curing mechanism. Chlorosilanes such as dichlorosilane can also be used for Grignard synthesis of phenoxyphenylsilane or phenoxyphenoxyphenylsilane monomers.

In an embodiment, a monomer of either formulas I or II can be polymerized by conventional hydrolysis polymerization. Thus a monomer of formula I or II can be homopolymerized or it can be copolymerized with a monomer of the other formula (II or I).

It is also possible to prepare a copolymer with either of monomers of formula I or II with another monomer selected from the group of silane, germane and zirconium alkoxide and combinations thereof. Thus, terpolymers can also be produced.

"Formula II" covers formulas IIa and IIb.

In embodiments, basic or acidic catalysts are used.

In one embodiment, before the condensation reaction, some or all alkoxy groups are hydrolyzed to silanol groups. Base catalysis favors the reaction between alkoxy group and silanol group, and this property can be used to ensure successful co-polymerization reaction between different silane monomers. Base catalysis is also favored, if acid-sensitive functional groups such as vinyl ethers are present.

For example, bis(p-phenoxyphenyl)dimethoxysilane [Bis(PhOPh)DMOS] can be hydrolyzed with dilute HCl, to yield bis(p-phenoxyphenyl)dihydroxysilane, which can be isolated and stored because of the relatively good general storage stability of bisarylsilanediols.

Then, it can be polymerized with, for example methacryloxymethyltrimethoxysilane (MAMTMOS) using alkaline metal hydroxides such as LiOH, NaOH, KOH, $Ba(OH)_2$ or their alkoxides such as NaOMe, ammonia, amines, various phosphazene super bases, guanidines or tetraalkylammonium hydroxides such as tetrapropylammonium hydroxide.

The heterocondensation by-product is methanol, and silanol-silanol homocondensation reaction is often just a small side reaction. Base catalysis is thus favored, if monomers with high differences in their general reactivities are polymerized.

Acid catalyzed polymerization of alkoxysilane (or silylhalides or acyloxysilanes) is accomplished by using dilute acid solutions to both hydrolyze and polymerize silane monomers simultaneously. However, hydrolyzation and polymerization can also sometimes be done separately. Acid catalysis is favored polymerization method if base-sensitive functional groups are present, which one does not want to react during polymerization (such as Si—H or some ester-linkages). Often, dilute mineral acids such as d.HCl, $d.H_2SO_4$ or $d.HNO_3$ are used. Also carboxylic acids such as acetic acid or oxalic acid can be used. Various phosphonitrilic chlorides are also found to be excellent silanol condensation catalysts. Lastly, some weakly acidic salts can also promote silanol condensation, such as pyridinium hydrochloride.

The concentration of the dilute acids is typically 0.001 M to 1 M, in particular from 0.01 to 0.5 M.

Generally in any of the above copolymers, the combined mole % of monomers A (monomer of formula I) and monomer B (monomer of formula II) in the polymer synthesis is at least 10 mol % of the total monomer amount, preferably at least 20 mole %, for example at least 30 mole %, at least 40 mole %, at least 50 mole %, at least 60 mole %, at least 70 mole %, at least 80 mole % or at least 90 mole %.

Polymerization can be carried out at increased temperature optionally in the presence of added catalysts (0.0001 to 5 mole %, for example 0.001 to 2.5 mole %, calculated from the total molar amounts of monomers and catalysts).

In the presence of added catalysts, the polymerization is typically carried out at low or moderate temperatures from about 10 to 200° C., for example 20 to 180® C., or 30 to 170® C., or 40 to 150° C.

Typically, in the absence of an added catalyst, the temperature is in the range of 200 to 500° C., for example 200 to 400° C., for instance 200 to 350° C. In particular, without condensation catalysts temperatures between 200 and 400° C. are usually required.

In addition to the basic or acidic catalysts discussed above, the catalysts employed can be selected from the group of zirconium alkoxide and titanium alkoxide catalysts.

In one embodiment, hydrolyzation and polymerization is carried out in the presence of water.

In one embodiment, hydrolyzation and polymerization is carried out in the absence of water.

Solvents such as acetone, isopropanol, toluene, or methanol can be used to get the components into a single phase or to facilitate proper stirring.

Anhydrous polymerization can be also used to form siloxane polymers. For example, reaction between alkoxysilanes and acyloxysilanes creates siloxane polymers and is catalyzed by titanium or zirconium alkoxides. The condensation co-product is an ester, for example methyl acetate in case of methoxysilane and acetoxysilane.

The fourth reaction that can be used to polymerize the silane monomer of the invention is acid or base catalyzed ring opening polymerization of cyclic siloxanes. e.g. bis(phenoxyphenyl)-dimethoxysilane (Bis(PhOPh)DMOS) can be hydrolyzed and condensed into cyclic trimers, tetramers or pentamers, that can undergo ring opening in right conditions to yield linear polymer. Other cyclic silanes can be copolymerized along with cyclic bis(phenoxypheny)siloxanes.

The polymer can be essentially linear or it can contain one or more monomers providing side groups to the main chain. Molecular weight can vary between 500 and 1,000,000 g/mol, more preferably between 500 and 10,000 g/mol.

In one embodiment, the polymer chains are crosslinked by crosslinkable groups of at least one species selected from the group of Si—OH, Si-OMe, Si-OEt, Si-H, vinyl, acryl, methacryl, epoxy, acetoxy and mercapto groups.

One aim of crosslinking is to set the material so that it no longer flows. Some crosslinking systems are one component, others are two component. For example, peroxide curing is one component system, while platinum-curable compositions consist of two components, the first having Si-vinyl -containing polymer and platinum, e.g. platinum-divinyltetramethyldisiloxane complex (Karstedt's catalyst) plus optional inhibitor such as ETCH (1-ethynylcyclohexanol) and phosphines, and the second component having siloxane polymer with Si—H functional groups. Furthermore, siloxane resins can sometimes be thermally cured even in the absence of any specific crosslinking groups using just heat to crosslink residual silanol groups.

In one embodiment, a polymer obtained by any of the above embodiments, exhibits an Oxygen Transmission Rate (OTR) and a Water Vapor Transmission Rate (WVTR) which is less than 50% of the corresponding OTR and WVTR values of phenylsilicone elastomers.

In one embodiment, polymer composites are provided. The composites are in particularly provided from a polymer according to any of the embodiments disclosed above in combination with metal, silicon oxide, or diamond, in the shape of particles, flakes, nanoparticles or nanorods.

In one embodiment, the polymer can also be blended with fumed silica, carbon black, metal oxides such as $ZrO_2$, $TiO_2$, $BaTiO_3$, $Ta_2O_5$, $Al_2O_3$, silver particles, nano diamonds, gold nanorods, glass fibers, color inks or other polymers, in order to tailor specific properties of the polymer system. For example titanium oxide (including barium titanium oxide) and zirconium oxide nanoparticles or combinations thereof can be used to further increase the refractive index of the polymer.

"Nanoparticles" typically have a spherical shape with a diameter in the range of 10 to 980 nm, in particular 20 to 750 nm, or a shape different from spherical with a largest dimension in the range of 10 to 980 nm, in particular 20 to 750 nm. Commonly, the diameter or largest dimension discussed in the foregoing are in the range of about 30 to about 600 nm, for example 30 to 500 nm.

In one embodiment, depending on the curing system and intended application, thermo acid generators, thermo base generators, radical initiators, noble metal catalysts such as platinum, light induced radical, base or acid generators, tin-catalysts and titanium alkoxides can be added to facilitate polymer crosslinking.

Also, commercial heat and light stabilizers such as hindered amines, phosphines, phenolic stabilizers can be incorporated to further enhance those properties.

Generally, the amount of added components in the polymer composites of any of the above embodiments, is typically 0.1 to 75 wt %, typically 1 to 70 wt %, for example 2.5 to 60 wt %, or 5 to 40 wt %, of the total weight of the polymer composite.

In one embodiment, the polymer composite contain 1 to 75 wt %, in particular 2.5 to 70 wt %, for example 5 to 65 wt %, of nanoparticles, such as titanium oxide, including $BaTiO_3$ or zirconium oxide or combinations thereof.

The polymers and the polymer composites can be used for producing films. Typically such films have thicknesses in the range of 0.01 μm to 3 mm, for example 0.05 to 500 μm.

A film made of a polymer or a polymer composite of the above embodiments can be produced by a technique selected from the group of spin-on, spraying, dip-coating, slit-coating or screen-printing the polymer, followed by optional drying and curing by moisture, heat or UV.

The polymers or polymer composite, optionally in the form a films, can be employed in the following applications, to mention a few: in optoelectronic devices such as LED, OLED, such detectors, ambient light sensors, CMOS image sensors and camera and lens elements. According to the invention the materials and polymer of the invention are also preferably used in chip-scale, flip-chip, wafer and panel level packaging.

Figure 5:
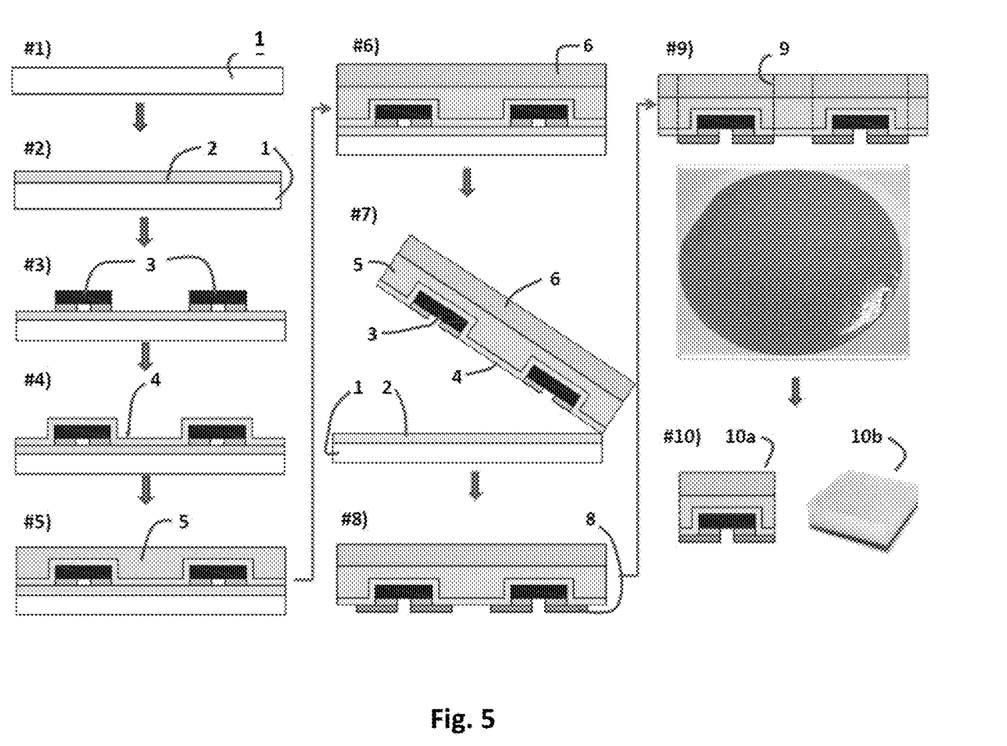
FIG. 5 shows a various manufacturing steps of an optical device utilizing polymers of the present invention.

The manufacturing of optical devices are depicted, step-by-step, in the attached drawing (FIG. 5). More particularly, FIG. 5 describes the process flow for chip-scale wafer level packaging of LED flip chip devices with materials and polymers according to one embodiment of the invention.

The process comprises but is not limited to following steps and provided features:

Steps:
1) Temporary carrying substrate 1;
2) Temporary bonding layer coating or lamination 2 on a temporary carrying substrate 1;
3) Attachment of plurality of flip-chip LED semiconductor chips 3 on the temporary bonding layer 2;
4) Light extraction layer and/or chip passivation layer 4 of the LED semiconductor chip 3 and/or its interconnects, or wavelength converter comprising wavelength conversion layer all comprising a materials or polymer of according to the invention;
5) Encapsulation of the LED chip with materials and polymers 5 according to the invention with or without wavelength converter;
6) Anti-reflection layer 6, hard coating or transparent protective film/lid;
7) Release of coated and encapsulated devices from the temporary bonding layer;
8) Printing solderable contacts 8 on the LED chip interconnects;
9) Singulation 9 the plurality of LED chips to individual LED devices; and
10) Provision of Final device. The device is shown both in cross-sectional sideview (10*a*) and in perspective view (10*b*).

The following non-limiting examples illustrate embodiments.

EXAMPLES

Example 1

THF (150 g), magnesium (26 g), tetramethoxysilane (150 g) were placed in a 1L three-neck flask under dry nitrogen, and heated to reflux. Para-bromophenyl ether was slowly dripped in. More THF (~200 mL) was gradually added to facilitate magnetic stirring. When the reaction was over, judged by GC./MS, heptane was added to precipitate magnesium salts. After filtration, solvents were removed in rotary evaporator. Distillation of the crude product gave two fractions (PhOPh)Si(OMe)$_3$, bp 120° C./0.1 mbar and Bis(PhOPh)Si(OMe)$_2$, bp 220° C./0.1 mbar.

Example 2a

Bis(PhOPh)DMOS (10 g) was hydrolyzed in a 100 mL flask with 10 g methanol and 1 g 0.1M HCl. When one phase was formed, more DIW (10 g) was gradually added and stirred for 1 h. Then, more DIW was added (50 g) to precipitated Bis(PhOPh)Si(OH)₂ as white solids. Water layer was decanted, and the solids washed twice with DIW and dried overnight. GPC of the solids showed only one sharp peak, indicating the material was pure.

Example 2b

Figure 1:
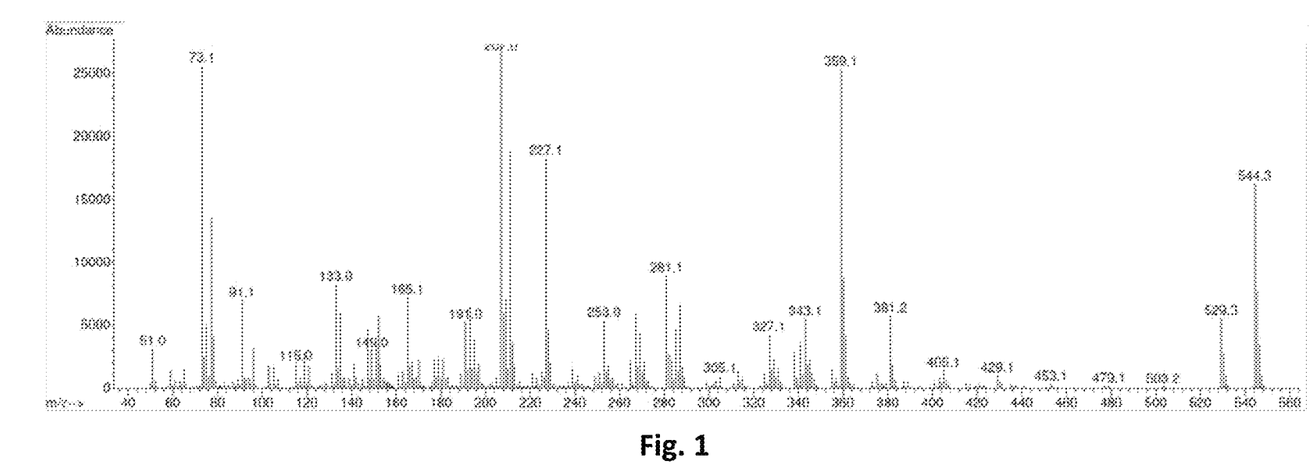
FIG. 1 shows the Mass Spectrum of bis(phenoxyphenyl)-bis(trimethylsiloxy)silane.

Bis(PhOPh)Si(OH)₂ (0.1 g) was dissolved in dry THF in a 8 mL glass vial, and triethylamine (1 mL) and trimethylchlorosilane (1 mL) were quickly added in. The vial was shaken for two minutes and the TEA-salts were removed by filtration. GPC and GC./MS of the sample (FIG.) showed a peak at m/z=544, that corresponds to expected bis(phenoxyphenyl)-bis(trimethylsiloxy)silane. It has molecular weight of 544.85.

The MS-spectrum bis(phenoxyphenyl)-bis(trimethylsiloxy)silane is shown in FIG. 1.

Example 3. PhOPhSi(OH)₃

Figure 2:
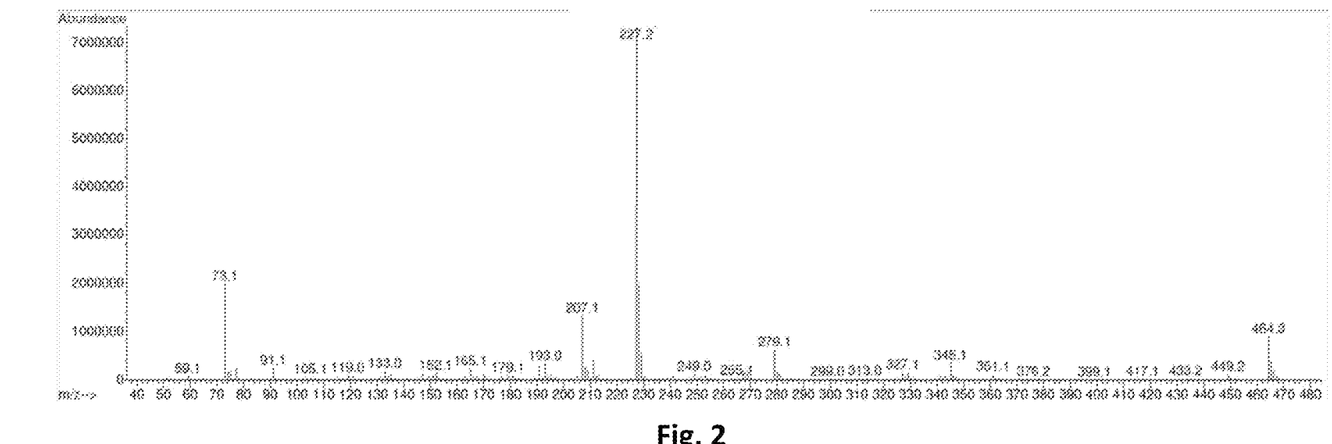
FIG. 2 shows the Mass Spectrum of tris(trimethylsiloxy)-phenoxyphenylsilane.

PhOPhTMOS (20 g) from Example 1 was diluted with methanol (20 g). 0.1M HCl (1 g) was added, followed by slow addition of DIW (100 g). White powderous precipitate was formed. It was filtered, washed with DIW and dried under vacuum at 35° C. for two hours. Small sample (0.1 g) of the powder was dissolved in THF (1 mL), and TMS-silylated by quickly adding it to a solution of MTBE (4 mL), trimethylchlorosilane (TMSCL, 1 mL) and dry triethylamine (1.5 mL). GC./MS of the sample gave one peak at m/z=464 (FIG.), corresponding to tris(trimethylsiloxy)-phenoxyphenylsilane. This shows, that the white powder was p-phenoxyphenyltrihydroxysilane, PhOPhSi(OH)₃. It has molecular weight of 464.85.

The MS-spectrum tris(trimethylsiloxy)-phenoxyphenylsilane is shown in FIG. 2.

Example 4. PhOPhOPhTMOS

Para-bromophenyl phenyl ether (20 g), p-bromophenol (9 g), $K_3PO_4$ (17 g), $Cu(BiPy)_2BF_4$ (1 g, "Cu*", a soluble copper catalyst by N. Jiajia et.al., J. Org. Chem. 2008, 73, 7814-7817) and dimethylformamide (DMF, 60 mL) were placed in a 250 mL rb flask with a loose stop cock, and the system was heated and stirred for three days at 100° C. The solution was poured into water, and organics were dissolved in dichloromethane (DCM). After solvent evaporation and vacuum distillation (<1 mbar, 180° C.), seven grams of p-(phenoxyphenoxy)bromobenzene (PhOPhOPhBr)was obtained. It was further purified by recrystallization from MeOH, to yield pure white crystals. Six grams of PhO-PhOPhBr was dissolved in dry THF (15 g), and magnesium turnings (1 g) and TMOS (5 g) were added. The system was refluxed for 2 hours during which the reaction took place. THF was then evaporated, and the product was washed in toluene/DIW.

After distillation at <1 mbar/~200° C., ~5 grams of phenoxyphenoxyphenyltrimethoxysilane (PhOPhOPhTMOS) was obtained in 95+% purity by GC./MS. The monomer was hydrolyzed and polymerized in acetone by dil. HCl to yield a mixture of both oligomers and polymer (Mw/Mn=2325/1924 by GPC), from which the polymer formed a colorless film by spin coating and curing at 250° C. The film had high refractive index (RI=1.612 at 633 nm).

Figure 3:
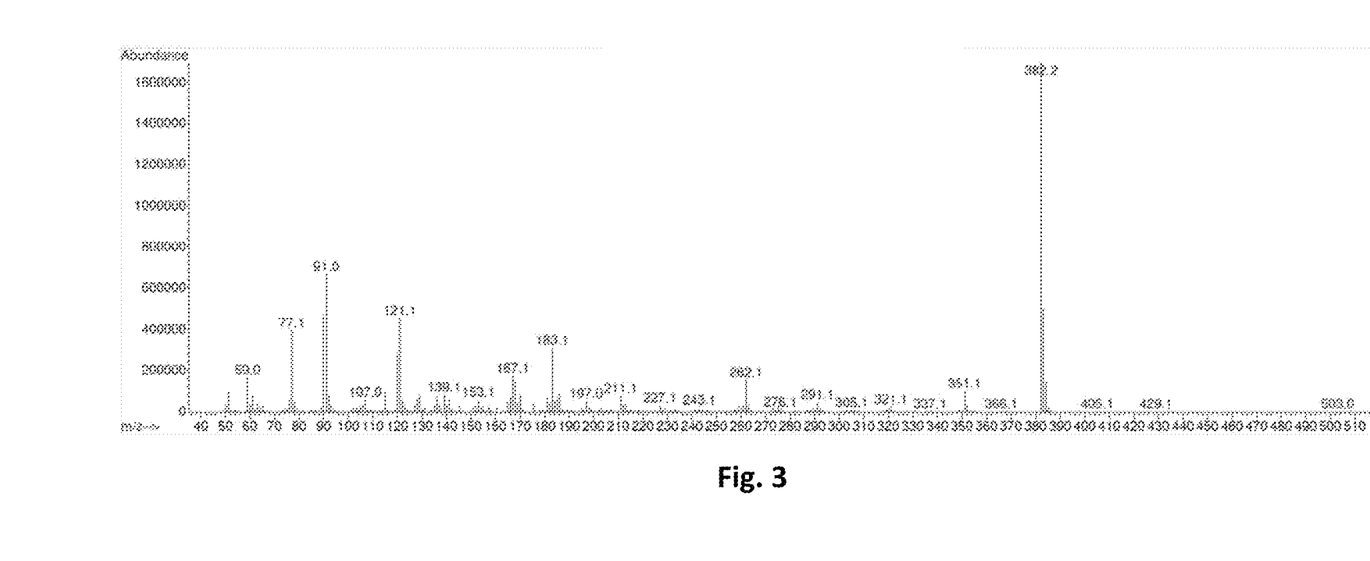
FIG. 3 shows the Mass Spectrum of PhOPhOPhTMOS.

The Mass spectrum of PhOPhOPhTMOS is shown in FIG. 3.

Polymer Example 1

PhOPhOPhTMOS (3 g) was hydrolyzed and polymerized in acetone (3 g) by dil. HCl (1 g) to yield a mixture of both oligomers and a polymer fraction (Mw/Mn=2325/1924 by GPC), from which the polymer formed a colorless film by spin coating and curing at 250° C. The film had high refractive index (RI=1.612 @633 nm).

Polymer Example 2

All of the crude $Bis(PhOPh)Si(OH)_2$ from Example 2, PhOPhTMOS (5 g), methacryloxymethyltrimethoxysilane (2 g) and 0.2 g 5% $Ba(OH)_2$ in methanol were placed into the flask. The flask was heated to 80° C. while stirring for 1 hours. After cooling the reaction to room temperature, barium hydroxide was neutralized with excess HCl and washed neutral with DIW in DCM solution. Drying at 95° C./1 mbar gave 13.8 g polymer with $M_w/M_n$=1389/884 and refractive index of 1.60171. It was formulated with Ciba® Darocur® 1173 (2%), and cured under mercury lamp @365 nm (6J/cm^2, 30 sec). A flexible, colorless film was obtained.

Polymer Example 3

PhOPhTMOS (6.5 g) and 3-methacryloxypropyltrimethoxysilane (MAPTMOS, 4.5 g) were placed in 100 mL rb flask along with 0.5 mL $Ba(OH)_2$/methanol solution (5%). The flask was heated to 70° C., and $Bis(PhOPh)Si(OH)_2$ (10 g) and $PhOPhSi(OH)_3$ (2.15 g) were gradually added in while temperature was risen to 80° C. After 2 h reaction, the polymer was washed neutral in toluene with 0.1MHI and DIW, and precipitated twice from methanol. After drying, a clear polymer with $M_w/M_n$=2147/1265 and RI=1.59408 was obtained. It was formulated with Ciba® Darocur® 1173 (2%), and cured under mercury lamp @365 nm (6 J/cm^2, 30 sec). A flexible, colorless film was obtained.

Polymer Example 4

PhOPhTMOS (15 g) and Bis(PhOPh)DMOS (5 g) were placed in a 50 mL rb flask with 0.5 mL $Ba(OH)_2$/methanol solution (5%). The flask was heated to 85° C., and $Bis(PhOPh)Si(OH)_2$ (25 g) was gradually added in. Temperature was risen to 90° C. After a 1 h reaction, the polymer was washed neutral in toluene with 0.1MHI and DIW, and precipitated twice from methanol. After drying, a clear polymer (42 g) with $M_w/M_n$=2325/1580 was obtained. The polymer was dissolved in acetone (80 g) and 5 drops of cHCl was added, followed by slow addition of DIW (~100 mL). This way, terminal Si-OMe groups were hydrolyzed to Si—OH groups.

The polymer ($M_w/M_n$=1483/916 by GPC) was separated, dried, and divided into two ~18 g parts "A" and "B". The "A" part was diluted with 30 mL THF, and 1,3-divinyltetramethyldisilazane (5 g) was added, along with small amount of perfluoroaniline-trifluoromethane sulfonate salt as a catalyst. The reaction was allowed to proceed for 24 h at room temperature. The part "B" was treated similarly, but using 1,1,3,3-tetramethyldisilazane as the silylating agent for Si—OH groups. The molecular weights of the two polymers were: A-$M_w/M_n$=1870/1348, B-$M_w/M_n$=1714/1164.

Both "A" and "B" were evaporated, diluted with toluene and washed several times with dilute HCl and DIW, followed by drying in rotary evaporator.

Curing: The "A" part was formulated with Karstedt platinum (2% xylene solution from Aldrich) as 20 ppm Pt. Equivalent amount of part "B" was blended with aforementioned mixture of Part A and platinum. It was cured as a 50 μm thick film in an oven 150° C./1 hour. The film had initial transparency of 98.5%, which was not changed under UV-A irradiation (8 mJ/cm², 2 weeks). Also, transparency was more than 95% after heating the film for 300 h at 190° C. Oxygen Transmission Rate (OTR) was measured 240 cc/m²/day (at 23° C.) for a film with thickness of 0.56 mm, and Water Vapor Transmission Rate (WVTR) 3.4 g/m²/day, 90% RT, 23° C. Thus, OTR for this material is ~3 times smaller than for commercial phenyl silicone elastomer (~1120, Tx 0.91 mm) and WVTR is ~3½ times smaller (~19, Tx 0.91 mm). This is important, since some phosphors which are mixed with LED-siloxane resin to give high-CRI (color rendering index) white light are moisture and oxygen sensitive. A thinner film of the mixture Part A+Part B was formed by spin casting it from 20% xylene solution, followed by baking at 150° C./1 hour. Colorless film with Tx~1 μm and RI ~1.61 at 633 nm was obtained, as measured by Woollam ellipsometer.

The 1:1 mix of Part A+Part B (total 0.5 g) was also formulated with ZrO$_2$-nanoparticles (2 g, 27% solution in MIBK (MZ-300B by Sumitomo), polymer:ZrO$_2$-np ~1:1). The solution was filtered through a 0.45 μ PTFE filter and spin coated on a silicon wafer. After curing at 150° C. for 1 h, a clear, transparent 1.5 micron film was formed with RI=1.72. The film remained colorless several days in an oven at 190° C., indicating good thermal stability.

Example 5

1,5-Dimethyl-1,1,5,5-tetramethoxy-3,3-bis(p-phenoxyphenyl)-trisiloxane (BisOHmer) Methyltrimethoxysilane (200 g), Bis(p-Phenoxyphenyl)silanediol (150 g) and 1,2-ethylenediamine (10 g) were stirred 20 hours at −10° C., after which volatiles were removed in rotary evaporator and the product, 1,5-dimethyl-1,1,5,5-tetramethoxy-3,3-bis(p-phenoxyphenyl)-trisiloxane was distilled at 260° C./<0.1 mbar (223.19 g, yield 73%).

BisOHmer (35.51 g), 3-hydoxy-3,3-bis(trifluoromethyl)propyltriethoxysilane (3.52 g), tetramethoxysilane (12.5 g), 0.01M HCl (10.7 g) and methanol (51.5 g) were refluxed 4 hours in a 250 mL rb flask. Volatiles were then removed in rotary evaporator, and PGMEA (3×50 g) was added and evaporation continued until PGMEA was the only solvent of the polymer solution. A 27 percent solution in PGMEA was prepared, and 2% by dry weight of photo acid (a 50% solution of triarylsulfonium hexafluoroantimonate salt one propylene carbonate) was added.

The solution was filtered through a 0.45 μm PTFE filter and spin coated on a silicon wafer. After soft bake at 100° C./5 min, exposure by i-line (400 mi/cm$^2$) and post exposure bake at 100° C./5 min, pattern could be developed with 2.38% tetramethylammonium hydroxide water solution. After final cure, a transparent film with an RI=1.56 was obtained.

Polymer Example 5

Part "A" and part "B" from Polymer Example 4 were mixed at a ratio of 1:1, along with 40 ppt of Karsted Pt. Barium titanate nanoparticles (Nagase NAB-447GBF, 20% solution in PGME) were added twice the mass of combined A&B.

The film was spin coated on a silicon wafer and cured overnight at 200° C. A 400 nm film was obtained with an RI=1.76 (measured at 632 nm). A film spin coated on a sodalime glass plate remained clear and colorless after one week at 200° C./air. The haze-value was only 0.3. By comparison, BaTiO$_3$-nanoparticles blended similarly with commercial phenyl silicone (OE-6631 by Dow Corning) gave visually cloudy film with measured haze-value of 3.8.

Figure 4:
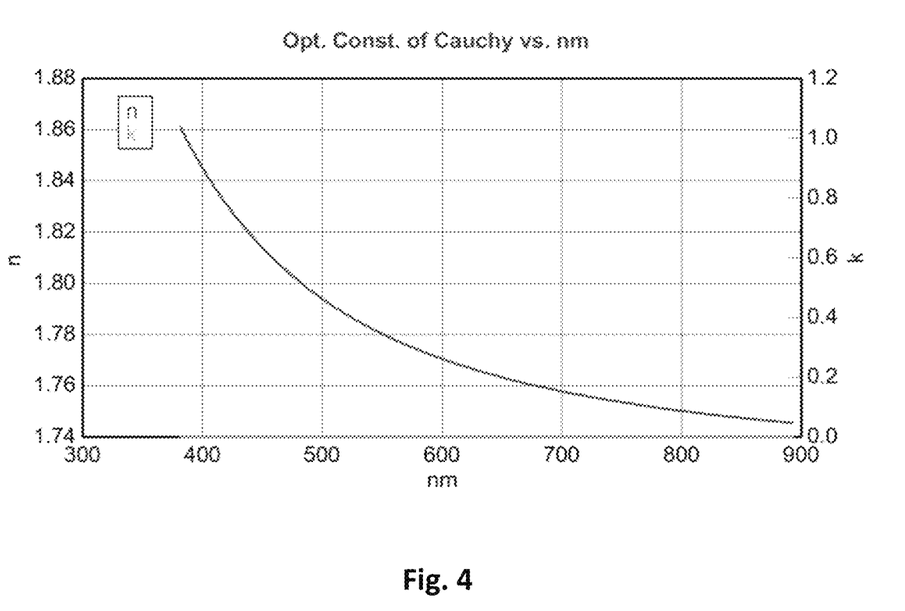
FIG. 4 shows the optical constant of Cauchy vs. wavelength.

FIG. 4 shows Wollam n&k data between 400 . . . 900 nm for BaTiO$_3$ containing material from Example 5 after cure.

Polymer Example 6

Diphenylsilanediol (60.0 g), Bis(PhOPh)Si(OH)$_2$ (60.0 g), 3-methacryloxypropyltrimethoxysilane (57.4 g), methyltrimethoxysilane (18.8 g) and BaO (108 mg) in methanol were placed in a 500 mL flask and refluxed for 1 hour at 80° C. The volatiles were evaporated under reduced pressure. A clear polymer resin (167 g) was obtained.

The weight average molecular weight (Mw) of the polymer was measured by Agilent GPC. The polysiloxane has Mw of 3050 g/mol. FTIR analysis was performed to detect OH-groups.

Polymer Example 7

4.0 g polymer resin having a high index of refraction, prepared as described in Example 5, resin was dissolved in PGMEA. 0.25 g photoinitiator (Darocur 1173 by BASF), 4.0 g trimethylolpropane triacrylate and 20 mg surfactant (BYK-307 by BYK Chemie) were added to the solution.

The obtained material was spin-coated on a 100 mm silicon wafer at 2000 rpm. The film was baked at 80° C. 5min on a hot plate and UV-cured with dose of 500 mJ/cm$^2$. The refractive index was 1.58 (at 633 nm) and 1.62 (at 400 nm).

Polymer Example 8

2.5 g polymer resin having a high index of refraction, prepared as described in Example 5, was blended with 5 g ZrO$_2$ nanoparticle solution in 1,2-propanediol monomethyl ether acetate (PGMEA) having a solid content of 50%. 0.13 g photoinitiator (Darocur 1173 by BASF), 2.5 g trimethylolpropane triacrylate, and 20 mg surfactant (BYK-307 by BYK Chemie) were added to the solution.

The obtained material was spin-coated on a 100 mm silicon wafer at 2000 rpm. The film was baked at 80° C. for 5 min on a hot plate and UV-cured with dose of 500 mJ/cm$^2$. The refractive index was 1.65 (at 633 nm) and 1.69 (at 400 nm).

In the following embodiments are listed: 1. 1,5-Dimethyl-1,1,5,5-tetramethoxy-3,3-bis(p-phenoxyphenyl)-trisiloxane.

2. A polymer obtained by hydrolysis and polymerization of one, two or three of the monomers of the following siloxanes monomer:

siloxane monomer A having the formula (Ph-O-Ph)$_2$Si(X)$_2$ wherein each X is a hydrolysable group independently selected from hydrogen and an alkoxy group having 1 to 6 carbon atoms, optionally containing an alkoxy substituent, halo, hydroxy or -OSiMe$_3$;

siloxane monomer B having the formula

PhOPh-Si(X)$_3$ wherein each X is a hydrolysable group independently selected from hydrogen and an alkoxy group having 1 to 6 carbon atoms, optionally containing an alkoxy substituent, halo, hydroxy or -OSiMe$_3$;

siloxane monomer C having the formula

PhOPhOPh-Si(X)$_3$ wherein each X is a hydrolysable group independently selected from hydrogen and an alkoxy group having 1 to 6 carbon atoms, optionally containing an alkoxy substituent, halo, hydroxy or -OSiMe$_3$; and 1,5-dimethyl-1,1,5,5-tetramethoxy-3,3-bis(p-phenoxyphenyl)-trisiloxane, with the proviso that at least one of the monomers is 1,5-dimethyl-1,1,5,5-tetramethoxy-3,3-bis(p-phenoxyphenyl)-trisiloxane.

3. The polymer according to embodiment 2, wherein in monomers A, B and C each X is a hydrolysable group independently selected from the group of -OMe, -OEt, —OPr, -OBu, $CH_2CH_2$—O—$CH_3$, —Cl, —Br, acetoxy, hydrogen, —OH and -$OSiMe_3$.

4. The polymer according to embodiment 2 or 3, further containing moieties of monomers selected from the group of silane, germane and zirconium alkoxide and combinations thereof, the combined mol % of monomers A, B and C or the amount of 1,5-Dimethyl-1,1,5,5-tetramethoxy-3,3-bis(p-phenoxyphenyl)-trisiloxane used in the polymer synthesis being at least 10 mol % of the total monomer amount.

5. The polymer of any of embodiments 2 to 4, obtained by polymerization in the presence of a catalyst, for example a basic or acidic catalyst, or a zirconium alkoxide or titanium alkoxide catalysts.

6. The polymer of any of embodiments 2 to 5, obtained by hydrolyzation and polymerization carried out in the presence of an increased temperature, optionally in the absence of added catalysts.

7. The polymer of any of embodiments 2 to 6, obtained by hydrolyzation and polymerization in the presence or absence of water.

8. A polymer according to any of embodiments 2 to 7 cross-linked by cross-linkable groups of at least one species selected from the group of Si—OH, Si-OMe, Si-OEt, Si—H, vinyl, acryl, methacryl, epoxy, acetoxy and mercapto groups.

9. A polymer of any of embodiments 2-8 which has an Oxygen Transmission Rate (OTR) and a Water Vapor Transmission Rate (WVTR) less than 50% of the corresponding OTR and WVTR of phenylsilicone elastomers.

10. A polymer of any of embodiments 2-9, in particular a polymer obtained by polymerization of a monomer of claim 1, having an RI greater than 1.7 (at 632 nm) optionally in combination with low haze, typically less than 0.5, and optionally in combination of non-yellowing.

11. A polymer composite made from a polymer according to any of embodiments 2 to 10 in combination with metal, silicon oxide, metal oxide or diamond, in the shape of particles, flakes, nanoparticles or nanorods.

12. A polymer composite according to embodiment containing 1 to 75 wt %, in particular 2.5 to 70 wt %, of nanoparticles, such as titanium oxide, including $BaTiO_3$ or zirconium oxide or combinations thereof.

13. A polymer composite according to embodiment 11 or 12, having a refractive index, RI (at 632 nm), greater than 1.7 and a haze % lower than 1.0, in particular lower than 0.75, for example lower than 0.5, such as lower than 0.35.

14. A film made of a polymer of any of embodiments 2 to 10 or a polymer composite of embodiments 11 to 13 by spin-on, spraying, dip-coating, slit-coating or screen-printing the polymer, followed by optional drying and curing by moisture, heat or UV.

15. Use of a polymer of any of embodiments 2 to 10 or a polymer composite of embodiments 11 to 13 in LED-devices.

16. Use of a polymer of any of embodiments 2 to 10 or a polymer composite of embodiments 11 to 13 in CMOS-image sensors.

17. Use of a polymer of any of embodiments 2 to 10 or a polymer composite of embodiments 11 to 13 in LCD-displays and OLED-devices.

18. Use of a polymer of any of embodiments 2 to 10 or a polymer composite of embodiments 11 to 13 in optical applications.

19. Use of an oligomer or polymer obtained by polymerization or copolymerization of the monomer 1,5-dimethyl-1,1,5,5-tetramethoxy-3,3-bis(p-phenoxyphenyl)-trisiloxane, optionally with a monomer having reactive groups,
    as a light extraction and/or passivation layer in LED, OLED or other optical device, or
    as a layer of a light emitting device, as a light extraction layer, chip passivation layer, chip interconnects passivation layer, encapsulation layer, a passivation layer and optical surface for a flip chip and EPI in a LED package.

20. Use of an oligomer or polymer obtained by polymerization or copolymerization of the monomer 1,5-dimethyl-1,1,5,5-tetramethoxy-3,3-bis(p-phenoxyphenyl)-trisiloxane, optionally with a monomer having reactive groups, in a layer of a chip scale packaging, wafer level packaging or panel packaging of LED, optical sensor or other optical device.

21. The use according to embodiments 19 or 20, wherein the monomer comprises reactive groups selected from vinyl, epoxy and acrylate and combinations thereof.

INDUSTRIAL APPLICABILITY

The polymers of the invention are suitable as LED encapsulant, as light guide material in CMOS image sensors, in OLED devices, lasers and in other optical applications.

In particular, with regard to the monomer 1,5-Dimethyl-1,1,5,5-tetramethoxy-3,3-bis(p-phenoxyphenyl)-trisiloxane (the "BisOHmer"), that monomer can be used for producing a (homo- or co)polymer which is used for example as a light extraction and/or passivation layer in LED, OLED or other optical device. A "BisOHmer" comprising oligomer or polymer can be used also as a layer of a light emitting device—referring to FIG. 5: as a light extraction layer #4, chip passivation layer #4, chip interconnects passivation layer #4, encapsulation layer #5, a passivation layer and optical surface for a flip chip and EPI in a LED package.

A "BisOHmer" comprising oligomer or polymer can further be a layer of a light emitting device. It can be any layer of chip scale packaging, wafer level packaging or panel packaging of LED, optical sensor or other optical devices.

REFERENCE SIGNS LIST

1 Temporary carrying substrate
2 Temporary bonding layer
3 Attachment of semiconductor chips
4 Light extraction layer and/or chip passivation layer
5 Encapsulation of the LED chip
6 Anti-reflection layer
7 Release of coated and encapsulated devices
8 Printing of solderable contact
9 Singulation of LED chips
10*a*, 10*b* Final device

CITATION LIST

Patent Literature

U.S. Pat. No. 4,278,784
U.S. Pat. No. 6,492,204
U.S. Pat. No. 6,806,509
US 2009146324)
U.S. Pat. No. 2,258,221
U.S. Pat. No. 3,385,878
US 2013045292

US 2013045552
FI 20155194

Non-Patent Literature

N. Jiajia et al., J. Org. Chem. 2008, 73, 7814-7817
W. Fink, Helvetica Chimica Acta 1973, 56(1), 355-63.

The invention claimed is:

1. A siloxane monomer A having the formula:

$$(\text{Ph-O-Ph})_2\text{Si}(X)_2 \tag{I}$$

wherein
each X is a hydrolysable group independently selected from the group consisting of -OMe, -OEt, -OPr, -OBu, —O—CH$_2$CH$_2$—O—CH$_3$, acetoxy, hydrogen and -OSiMe$_3$.

2. A siloxane monomer B having the formula:

$$\text{PhOPh-Si}(X)_3 \tag{IIa}$$

wherein
each X is a hydrolysable group independently selected from the group consisting of -OBu, —O—CH$_2$CH$_2$—O—CH$_3$, acetoxy, hydrogen and OSiMe$_3$..

3. The monomer of claim 2, wherein the monomer further comprises 1,5-Dimethyl-1,1,5,5-tetramethoxy-3,3-bis(p-phenoxyphenyl)-trisiloxane.

4. A siloxane monomer C having the formula:

$$\text{PhOPhOPh-Si}(X)_3 \tag{IIb}$$

wherein
each X is a hydrolysable group independently selected from hydrogen and lower alkoxy optionally containing an alkoxy substituent, halo, hydroxy or -OSiMe$_3$.

5. The monomer according to claim 4, wherein each X is a hydrolysable group independently selected from the group consisting of -OMe, -OEt, —OPr, -OBu, —O—CH$_2$CH$_2$—O—CH$_3$, —Cl, —Br, hydrogen, —OH and -OSiMe$_3$.

6. A polymer obtained by hydrolysis and polymerization 1,5-Dimethyl-1,1,5,5-tetramethoxy-3,3-bis(p-phenoxyphenyl)-trisiloxane with one, two or three of the following siloxane monomers A, B, C having a corresponding formula I, IIa amd IIb:

wherein siloxane monomer A comprises the formula:

$$(\text{Ph-O-Ph})_2\text{Si}(X)_2 \tag{I}$$

wherein each X is a hydrolysable group independently selected from hydrogen and lower alkoxy, optionally containing an alkoxy substituent, halo, hydroxy or -OSiMe$_3$;
and
wherein siloxane monomer B comprises the formula:

$$\text{PhOPh-Si}(X)_3 \tag{IIa}$$

wherein each X is a hydrolysable group independently selected from hydrogen and lower alkoxy, optionally containing an alkoxy substituent, halo, hydroxy or -OSiMe$_3$.
and
wherein siloxane monomer C comprise the formula:

$$\text{PhOPhOPh-Si}(X)_3 \tag{IIb}$$

wherein each X is a hydrolysable group independently selected from hydrogen and lower alkoxy, optionally containing an alkoxy substituent, halo, hydroxy or -OSiMe$_3$.

7. The polymer according to claim 6, further comprising moieties of monomers selected from the group consisting of silane alkoxide, germane alkoxide, zirconium alkoxide and combinations thereof, and wherein the combined mol % of monomer A, B and C used in the polymer synthesis is at least 10 mol % of the total monomer amount.

8. The polymer of claim 6, wherein the polymer is obtained by polymerization in the presence of a catalyst, and wherein the catalyst comprises a basic or acidic catalyst, or a zirconium alkoxide or titanium alkoxide catalyst.

9. The polymer of claim 6, wherein the polymer is obtained by hydrolyzation and polymerization carried out in the presence of an increased temperature, optionally in the absence of an added catalyst.

10. The polymer of claim 6, wherein the polymer is obtained by hydrolyzation and polymerization in the presence or absence of water.

11. The polymer of claim 6, wherein the polymer is cross-linked by cross-linkable groups of at least one species selected from the group consisting of Si-OH, Si-OMe, Si-OEt, Si-H, vinyl, acryl, methacryl, epoxy, acetoxy, and mercapto groups.

12. The polymer of claim 6, wherein the polymer has an Oxygen Transmission Rate (OTR) and a Water Vapor Transmission Rate (WVTR) of less than 50% of a corresponding OTR and WVTR of a phenylsilicone elastomer.

13. The polymer of claim 6, wherein the polymer has a refractive index greater than 1.7 (at 632 nm) and a haze % of less than 0.5.

14. The polymer of claim 6, further comprising metal, silicon oxide, metal oxide or diamond, in the shape of particles, flakes, nanoparticles or nanorods therein.

15. The polymer composite according to claim 14, wherein the polymer comprises 2.5 to 70 wt % of nanoparticles.

16. The polymer composite according to claim 14, wherein the polymer comprises a refractive index, RI (at 632 nm) greater than 1.7 and a haze % lower than 1.0.

17. The monomer according to claim 14, wherein the nanoparticles comprise a member selected from the group consisting of titanium oxide, barium titanate, zirconium oxide, and combinations thereof.

18. The polymer of claim 6, wherein the polymer is incorporated within a member from the group consisting of an optoelectronic device, a light extraction layer, an encapsulation layer, a passivation layer, and panel level packaging.

* * * * *